(12) United States Patent
Luo

(10) Patent No.: US 11,806,771 B2
(45) Date of Patent: Nov. 7, 2023

(54) MANUFACTURING METHOD OF MASK PLATE

(71) Applicant: BOE TECHNOLOGY GROUP CO., LTD., Beijing (CN)

(72) Inventor: Chengyuan Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1178 days.

(21) Appl. No.: 16/443,019

(22) Filed: Jun. 17, 2019

(65) Prior Publication Data

US 2020/0101513 A1 Apr. 2, 2020

(30) Foreign Application Priority Data

Sep. 29, 2018 (CN) .......................... 201811151706.2

(51) Int. Cl.
*B21D 11/02* (2006.01)
*C23C 14/04* (2006.01)
*B29C 70/74* (2006.01)
*B29K 705/00* (2006.01)
*H10K 71/00* (2023.01)
*H10K 71/16* (2023.01)

(52) U.S. Cl.
CPC .............. *B21D 11/02* (2013.01); *B29C 70/74* (2013.01); *C23C 14/042* (2013.01); *B29K 2705/00* (2013.01); *B29K 2905/00* (2013.01); *H10K 71/00* (2023.02); *H10K 71/166* (2023.02)

(58) Field of Classification Search
CPC ....... C23C 14/04; C23C 14/042; B21D 11/02; B21D 25/00; B21D 25/02; B21D 25/04
See application file for complete search history.

(56) References Cited

U.S. PATENT DOCUMENTS

2019/0105699 A1* 4/2019 Jiang ..................... B05C 21/005

FOREIGN PATENT DOCUMENTS

| KR | 20180037253 A | * | 4/2018 | ........... C23C 14/042 |
| WO | WO-2019012585 A1 | * | 1/2019 | ............. B21D 35/00 |

OTHER PUBLICATIONS

Translation of WO-2019012585 (Year: 2019).*
Translation of KR-20180037253 (Year: 2018).*

* cited by examiner

*Primary Examiner* — Bobby Yeonjin Kim
(74) *Attorney, Agent, or Firm* — Dilworth & Barrese, LLP.; Michael J. Musella, Esq.

(57) ABSTRACT

Embodiments of the present disclosure provide a manufacturing method of a mask plate. The manufacturing method of the mask includes: embedding a shaping mold in a mask region of a mask sheet; fixing the mask sheet with the shaping mold; performing a stretching process on the mask sheet fixed with the shaping mold; and separating the mask sheet from the shaping mold to form the mask.

14 Claims, 2 Drawing Sheets

MANUFACTURING METHOD OF MASK PLATE

The present application claims priority of Chinese Patent Application No. 201811151706.2, filed on Sep. 29, 2018, the disclosure of which is incorporated herein by reference in its entirety as part of the present application.

TECHNICAL FIELD

At least one embodiment of the present disclosure relates to a manufacturing method of a mask plate.

BACKGROUND

Organic light-emitting display (OLED) devices, such as active-matrix organic light-emitting diodes (AMOLEDs), have gradually received widespread attention due to advantages such as high color gamut, ultra-thin, flexible display, and the like. For example, organic light-emitting display devices having curved surfaces and flexible properties have been favored for their unique features and better user experience. A main manufacturing process of a light-emitting layer of an organic light-emitting display device comprises evaporation. For example, an organic material is heated to a certain temperature under vacuum, the organic material is vaporized and deposited on a surface of a substrate to form a thin film. In the above evaporation process, a mask plate is an essential component for manufacturing a thin film having a fixed shape. In the exiting evaporation technology, it is necessary to form organic light-emitting layers of different colors on an organic light-emitting diode display substrate by using a fine metal mask (FMM).

SUMMARY

An embodiment of the present disclosure provides a manufacturing method of a mask plate. The manufacturing method of the mask plate comprises: embedding a shaping mold in a mask region of a mask sheet; fixing the mask sheet with the shaping mold; performing a stretching process on the mask sheet fixed with the shaping mold; and separating the mask sheet from the shaping mold to form the mask plate.

For example, before the shaping mold is embedded in the mask region of the mask sheet, the manufacturing method further comprises: forming the mask region including a plurality of mask openings on the mask sheet, the shaping mold comprises a plurality of barrier columns, and embedding the shaping mold in the mask region of the mask sheet comprises: embedding at least a portion of the plurality of barrier columns in at least a portion of the plurality of mask openings.

For example, the shaping mold further comprises a supporting part, the plurality of barrier columns are located on the supporting part, and the plurality of barrier columns protrude from a surface of the supporting part; fixing the mask sheet with the shaping mold comprises: forming an adhesive layer on a side of the mask sheet away from the supporting part, to adhere the mask sheet to the plurality of barrier columns.

For example, a method of forming the adhesive layer on a side of the mask sheet away from the supporting part comprises: attaching an anti-adhesive film including the adhesive layer on the side of the mask sheet away from the supporting part. The adhesive layer is located on a side of the anti-adhesive film facing the mask sheet.

For example, after forming the adhesive layer on the side of the mask sheet away from the supporting part, to adhere the mask sheet to the plurality of barrier columns, the manufacturing method of the mask plate further comprises: forming an anti-adhesive film on a side of the adhesive layer away from the mask sheet.

For example, the shaping mold further comprises a supporting part, the plurality of barrier columns are located on the supporting part, and the plurality of barrier columns protrude from a surface of the supporting part; fixing the mask sheet with the shaping mold comprises: forming an adhesive layer on a side of the supporting part facing the mask sheet, to adhere the mask sheet with the supporting part. A material of the adhesive layer comprises a thermal separation adhesive, and the thermal separation adhesive is configured to fail after being heated to a preset temperature.

For example, a material of the adhesive layer comprises a thermal separation adhesive, and the thermal separation adhesive is configured to fail after being heated to a preset temperature.

For example, the preset temperature is 60° C.~100° C.

For example, a method of separating the shaping mold from the mask sheet to form the mask plate comprises: heating the mask sheet fixed with the shaping mold to the preset temperature to separate the shaping mold from the mask sheet.

For example, a size of at least one of the plurality of barrier columns in a direction perpendicular to a main plate surface of the mask sheet is greater than or equal to a thickness of the mask sheet.

For example, a surface of at least one of the plurality of barrier columns is provided with a cladding structure.

For example, a material of the cladding structure comprises a resin material.

For example, a material of the shaping mold comprises one or more selected from the group consisting of aluminum, magnesium, titanium and zinc.

For example, the plurality of barrier columns are embedded in the plurality of mask openings in a one-to-one correspondence manner.

BRIEF DESCRIPTION OF THE DRAWINGS

In order to clearly illustrate the technical solutions of at least one embodiment of the disclosure, the drawings of at least one embodiment will be briefly described in the following; it is obvious that the described drawings are only related to some embodiments of the disclosure and thus are not limitative to the disclosure.

DETAILED DESCRIPTION

Figure 1:
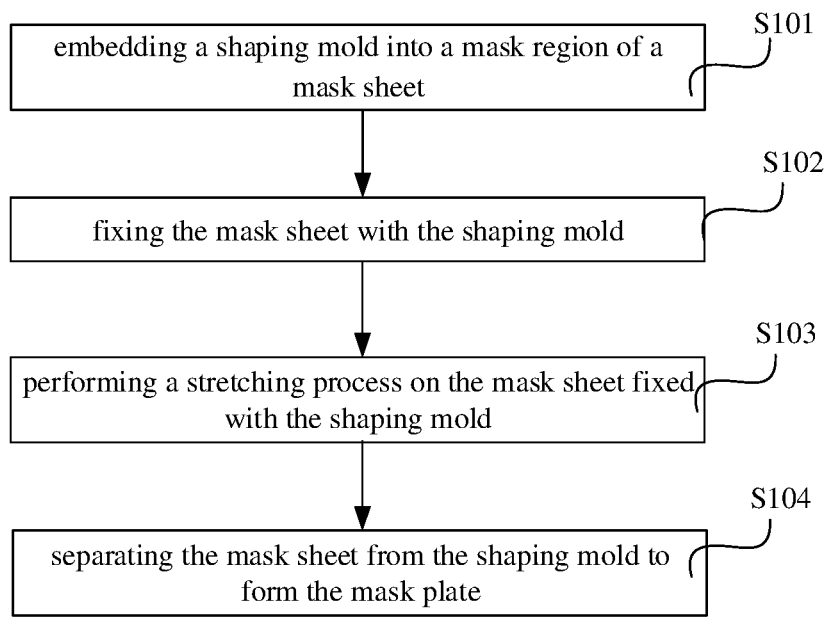
FIG. 1 is a flowchart of a manufacturing method of a mask plate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

In research, the inventors of the present application found that: upon manufacturing a fine metal mask, it is usually necessary to stretch a mask sheet by a stretching machine after performing mesh processing (that is, after forming a mask region on the mask sheet), so as to ensure the straightness and the flatness of a formed mask plate, and then the formed mask plate is fixed to a frame. However, during a stretching process, a mask region of the fine metal mask maybe deformed or even damaged, thereby affecting the effect of a film formed by evaporation. Therefore, how to protect the mask region of the fine metal mask during a process of stretching the mask sheet is particularly important.

A technology of performing evaporation on a display panel using a mask plate to form a desired film pattern (for example, in a process of fabricating an organic electroluminescence display device) comprises evaporating and coating different color light-emitting materials on an array substrate by using a mask plate to form corresponding sub-pixels. For example, the mask plate comprises a frame and a mask sheet fixed (for example, welded) on the frame, a mask region (for example, a region including a plurality of mask openings) is disposed on the mask sheet, and the mask region corresponds to a film pattern to be formed on a substrate to be film-formed. During evaporation, the mask plate is placed on a surface of the substrate to be evaporated, and an evaporation material is deposited on the surface of the substrate to be film-formed through the mask openings (hollow portions) in the mask region of the mask sheet, to form a desired film pattern to be formed.

It should be noted that, those skilled in the art will also refer to the above-mentioned mask sheet as a mask strip. Of course, those skilled in the art has other names for the above mask plate and composition thereof, for example, the whole composed of the frame and a plurality of mask sheets welded to the frame may be referred to as a mask frame assembly (MFA), in this case, the mask sheet may be referred to as a mask plate.

The above two examples are only different names, used by those skilled in the art in practical working applications, for the mask plate in the fine metal mask process, and the structures referred to by the two examples are the same. Hereinafter, the manufacturing method of the mask plate will be described in detail by taking the above-mentioned first appellation as an example.

At least one embodiment of the present disclosure provides a manufacturing method of a mask plate. The manufacturing method of the mask plate comprises embedding a shaping mold in a mask region of a mask sheet; fixing the mask sheet with the shaping mold; performing a stretching process on the mask sheet fixed with the shaping mold; and separating the mask sheet from the shaping mold to form the mask plate. Because the shaping mold has been embedded in the mask region of the mask sheet and the mask sheet is fixed together with the shaping mold before fixing the mask sheet on a frame by the stretching process, therefore, in a case that the mask sheet is stretched by the stretching process, the effect of preventing deformation of the mask region can be achieved.

The manufacturing method of the mask plate provided by at least one embodiment of the present disclosure can be described below with reference to the accompanying drawings.

Figure 2:
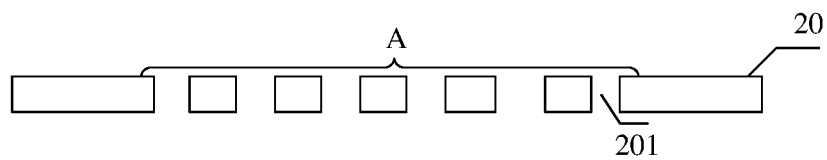
FIG. 2 is a schematic cross-sectional diagram of a mask plate provided by an embodiment of the present disclosure.
Figure 3A:
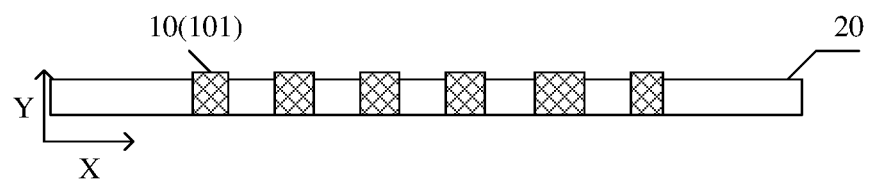
FIG. 3a is a schematic diagram of a mask region, in which a shaping mold is embedded, of a mask sheet provided by an embodiment of the present disclosure.
Figure 3B:
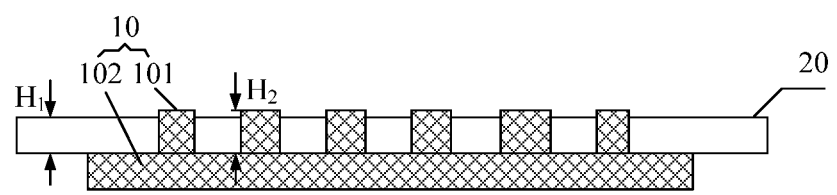
FIG. 3b is another schematic diagram of a mask region, in which a shaping mold is embedded, of a mask sheet provided by an embodiment of the present disclosure.

FIG. 1 is a flowchart of a manufacturing method of a mask plate provided by an embodiment of the present disclosure; FIG. 2 is a schematic cross-sectional diagram of a mask sheet on which a mask region is formed; FIG. 3a is a schematic diagram of a mask region, in which a shaping mold is embedded, of a mask sheet; and FIG. 3b is another schematic diagram of a mask region, in which a shaping mold is embedded, of a mask sheet. As shown in FIG. 1, the manufacturing method of the mask plate comprises the following steps.

S101, embedding a shaping mold in a mask region of a mask sheet.

For example, before the step S101, as shown in FIG. 2, the manufacturing method of the mask plate further comprises: forming a mask pattern on the mask sheet 20 to form the mask region A. For example, the mask sheet 20 may be patterned to form the mask region A.

For example, the mask region A may comprise a plurality of mask openings 201.

For example, the plurality of mask openings 201 form a grid structure.

For example, the mask sheet 20 in at least one embodiment of the present disclosure may also be referred to as a mask strip, the mask sheet 20 may have a structure as shown in FIG. 2, and a plurality of mask sheets 20 are fixed to a frame to form a mask plate.

For example, a material of the above mask sheet 20 may be metal. For example, the material of the mask sheet 20 may comprise one or more selected from the group consisting of a stainless steel foil, an Invar alloy, and a Kovar alloy. In a case where the material of the mask sheet 20 is metal, the formed mask may be referred to as a fine metal mask (FMM). At least one embodiment of the present disclosure does not limit the material of the mask sheet 20.

For example, as shown in FIG. 3a and FIG. 3b, the shaping mold 10 is embedded in the mask region A of the mask sheet 20.

For example, at least one embodiment of the present disclosure does not limit the structure of the shaping mold 10. For example, as shown in FIG. 3a, the shaping mold 10 can comprise a plurality of barrier columns 101. For example, as shown in FIG. 3b, the shaping mold 10 may further comprise a supporting part 102 in addition to the plurality of barrier columns 101, the plurality of barrier columns 101 are located on the supporting part 102, and protrude from a surface of the supporting part 102.

For example, in a case where the mask region A comprises a plurality of mask openings 201, the plurality of barrier columns 101 on the shaping mold 10 are formed according to positions and sizes of the mask openings 201 to exactly match a pattern of the mask region A.

For example, the plurality of barrier columns 101 are in one-to-one correspondence of the plurality of mask openings 201, and at least one embodiment of the present disclosure is not limited thereto. For example, the number of the barrier columns 101 may also be larger than the number of the mask openings 201, so long as the mask openings are all inserted by the barrier columns 101.

For example, forming the plurality of barrier columns may comprise: providing a shaping material; etching the shaping material to form a plurality of protrusions, the plurality of protrusions being the plurality of barrier columns corresponding to the mask region of the mask sheet, and a groove between adjacent protrusions is the supporting part.

For example, the material of the shaping mold 10 may comprise a light alloy composes of metals such as aluminum, magnesium, titanium, zinc, or the like, and at least one embodiment of the present disclosure does not limit the material of the shaping mold.

For example, the step S101 of embedding the plurality of barrier columns 101 in the mask region A of the mask sheet 20 may comprise: embedding the plurality of barrier columns 101 in the plurality of mask openings 201 (hollow portion) of the mask region A.

For example, a size of at least one of the plurality of barrier columns 101 in a direction perpendicular to a main plate surface of the mask sheet 20 is greater than or equal to a thickness of the mask sheet 20. For example, the barrier columns 101 may be fully embedded in the hollow portion of the mask region A of the mask sheet 20 in the direction (a thickness direction, that is, a Y direction shown in FIG. 3a) perpendicular to the mask sheet 20. Therefore, in a case that the mask sheet is stretched, or a stretching process is performed on the mask sheet, or the like, the barrier columns 101 located within the mask openings and fully embedded in the mask openings can prevent the mask openings from being deformed during the process of stretching, thereby ensuring the straightness and flatness of the mask plate. Of course, in at least one embodiment of the present disclosure, the size of the barrier column 101 in the Y direction may also be smaller than the thickness of the mask sheet, as long as the effect of ensuring the straightness and flatness of the mask plate can be achieved.

For example, in a case where the shaping mold 10 comprises the supporting part 102 and the barrier columns 101, the supporting part 102 and the barrier columns 101 may be formed by an integrated process, or the supporting part 102 may be formed first, and then the barrier columns 101 protruding from the surface of the supporting part 101 may be formed, at least one embodiment of the present disclosure is not limited thereto.

For example, in a case where the shaping mold 10 comprises the supporting part 102 and the barrier columns 101, after the barrier columns 101 are embedded in the mask region A of the mask sheet 20, the supporting part 102 can be in contact with the mask sheet 20, and the supporting part 102 can also be kept at a certain distance from the mask sheet 20, at least one embodiment of the present disclosure is not limited thereto.

S102, fixing the mask sheet with the shaping mold.

Figure 4A:
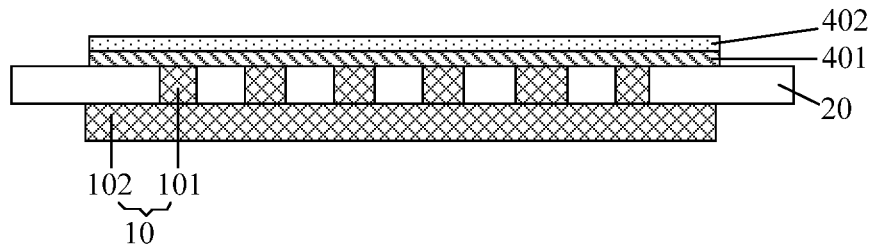
FIG. 4a and FIG. 4b are schematic diagrams showing performing a step of adhering the mask sheet shown in FIG. 3b to a shaping mold.

For example, as shown in FIG. 4a, in a case where the shaping mold 10 comprises the supporting part 102 and the barrier columns 101, the step S102 comprises: forming an adhesive layer 401 on a side of the mask sheet 20 away from the supporting part 102, to adhere the mask sheet 20 to the plurality of barrier columns 101.

For example, as shown in FIG. 4a, the step of forming the adhesive layer 401 on the side of the mask sheet 20 away from the supporting part 102 comprises: attaching an anti-adhesive film 402 including the adhesive layer 401 on the side of the mask sheet 20 away from the supporting part 102. The adhesive layer 401 is located on a side of the anti-adhesive film 402 facing the mask sheet 20. Alternatively, after the adhesive layer 401 is formed on the side of the mask sheet 20 away from the supporting part 102 to adhere the mask sheet 20 to the barrier columns 101, an anti-adhesive film 402 is formed on a side of the adhesive layer 401 away from the mask sheet 20.

For example, a material of the anti-adhesive film 402 may comprise Polycarbonate (PC). After the mask sheet 20 and the shaping mold 10 (such as, the barrier columns 101) are adhered together by the adhesive layer 401, the anti-adhesive film 402 can prevent the adhesive layer 401 from sticking to other structures when performing other processes.

For example, a material of the adhesive layer 401 may comprise a thermal separation adhesive, and the thermal separation adhesive is configured to fail after being heated to a preset temperature. For example, the thermal separation adhesive may be a resinous material having adhesiveness and have a property of adhesion failure after being heated to a certain temperature. In a case where a temperature at which the thermal separation adhesive fails is higher than 100° C., when the thermal separation adhesive is heated to fail, the mask sheet 20 is easily damaged to a certain extent; in a case where a temperature at which the thermal separation adhesive fails is lower than 60° C., the thermal separation adhesive is easy to fail under unexpected conditions, thereby separating the barrier columns 101 from the mask sheet 20 before the stretching process, and affecting the effect of preventing the mask region of the mask sheet 20 from being deformed by the barrier columns 101 in the stretching process. Therefore, the preset temperature in at least one embodiment of the present disclosure may be 60° C.~100° C. When the thermal separation adhesive is heated to 60° C.~100° C., the thermal separation adhesive lose adhesion. Therefore, the above preset temperature does not cause damage to the mask plate, and the thermal separation adhesive also does not fail before the stretching process to cause separation of the barrier columns 101 from the mask sheet 20.

For example, the preset temperature of the thermal separation adhesive may be 70° C.~90° C., or the preset temperature of the thermal separation adhesive may be 80° C.~95° C.

For example, in order to prevent the adhesive layer 401 such as the thermal separation adhesive from entering the mask region A of the mask sheet 20 to contaminate the mask region A of the mask sheet 20 when the shaping mold 10 is adhered to the mask sheet 20, a thickness $H_2$ of the barrier column 101 is greater than or equal to the thickness $H_1$ of the mask sheet 20 (as shown in FIG. 3b). Therefore, in the thickness direction of the mask sheet 20, the barrier columns 101 may be fully embedded in the mask region of the mask sheet 20, so that in a case where the adhesive layer 401 is formed on the side of the mask sheet 20 away from the supporting part 102, the adhesive layer 401 does not enter the mask region of the mask sheet 20, thereby preventing the adhesive layer 401 from contaminating the mask region of the mask sheet 20.

Figure 4B:
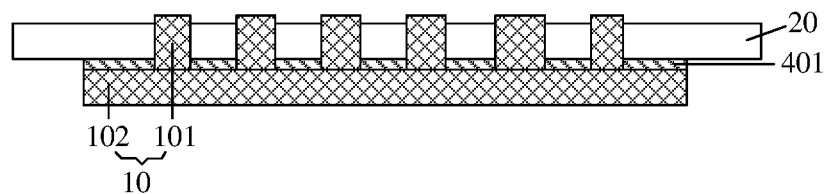

For example, in another example of the present disclosure, as shown in FIG. 4b, a step of fixing the mask sheet 20 with the shaping mold 10 comprises: forming an adhesive layer 401 on a side of the supporting part 102 facing the mask sheet 20, to adhere the mask sheet 20 with the supporting part 102. A material of the adhesive layer 401 comprises a thermal separation adhesive, and the thermal separation adhesive is configured to fail after being heated to a preset temperature. The adhesive layer shown in FIG. 4b has the same characteristics as the adhesive layer shown in FIG. 4a, and is not be described herein again. This example, by providing the adhesive layer on the shaping mold, not only can save the process, but also can prevent the adhesive layer from sticking to other structures in subsequent preparation process.

S103, performing a stretching process on the mask sheet fixed with the shaping mold.

Figure 5:
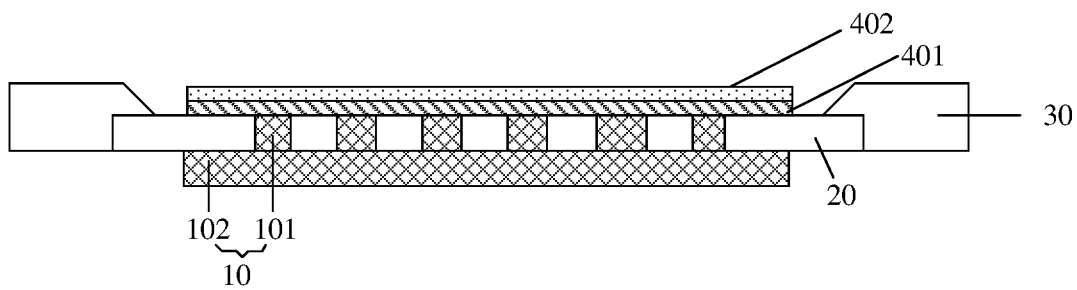
FIG. 5 is a schematic diagram showing fixing the mask sheet shown in FIG. 4a to a frame.

For example, as shown in FIG. 5, the mask sheet 20 is fixed to a frame 30 by the stretching process.

For example, when manufacturing the mask plate, the stretching process comprises: stretching the mask sheet and fixing (for example, welding) the mask sheet on the frame. A stretching direction may be a lateral direction (a width direction of the mask sheet) or a longitudinal direction (a length direction of the mask sheet) of the mask sheet, and the stretching direction is usually the length direction of the mask sheet. In at least one embodiment of the present disclosure, before performing the stretching process, the shaping mold has been embedded in the mask region A of the mask sheet 20, and the mask sheet 20 is adhered to the shaping mold 20, so that when the mask sheet 20 is stretched to be fixed to the frame 30, the probability of deformation of the mask region A can be reduced, thereby ensuring the straightness and the flatness of the mask plate.

For example, the frame 30 may be a metal frame.

S104, separating the mask sheet from the shaping mold to form the mask plate.

Figure 6:
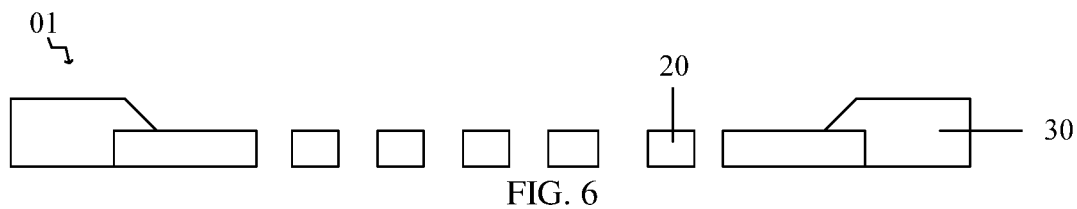
FIG. 6 is a structural diagram showing separating the mask sheet shown in FIG. 5 from a shaping mold to form a mask plate.

For example, after the shaping mold 10 is separated from the mask sheet 20, a mask plate 01 as shown in FIG. 6 can be formed.

For example, after the shaping mold 10 is separated from the mask sheet 20, in this case, the mask sheet 20 and the frame 30 shown in FIG. 6 constitute the mask plate 01. In addition, at least one embodiment of the present disclosure does not limit the method of separating the shaping mold 10 from the mask sheet 20, so long as the shaping mold 10 and the mask sheet 20 can be separated without causing damage to the mask sheet 20.

For example, a step of separating the shaping mold 10 and the mask sheet 20 shown in FIG. 4a or 4b may comprise: heating the adhesive layer on the mask sheet 20 fixed on the frame 30 by the stretching process to a preset temperature, for example, heating to 60° C.-100° C., so that the adhesiveness of the adhesive layer including the thermal separation adhesive fails, thereby separating the shaping mold 10 from the mask sheet 20. In this case, the frame 30 and the mask sheet 20 fixed together constitute a mask plate. Therefore, on one hand, by heating the adhesive layer, the mask sheet 20 can be separated from the shaping mold 10, thereby reducing the difficulty in the manufacturing process of the mask plate; on the other hand, after the thermal separation adhesive is heated to the preset temperature to cause the thermal separation adhesive to fail, the mask sheet 20 and the shaping mold 20 can be completely separated, so as to prevent impurities from remaining on the surface of the mask sheet 20.

Figure 7:
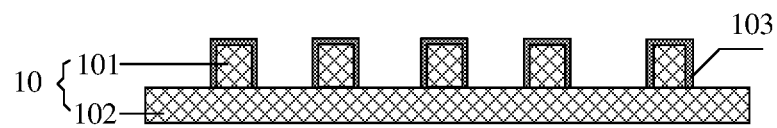
FIG. 7 is a schematic structure diagram of a shaping mold provided by an embodiment of the present disclosure.

For example, as shown in FIG. 7, in an example of the embodiment of the present disclosure, a surface of at least one of the barrier columns 101 is provided with a cladding structure 103. For example, a material of the cladding structure 103 may comprise a resin material.

For example, the manufacturing method of the mask plate provided by at least one embodiment of the present disclosure comprises embedding the barrier columns 101 in the mask region of the mask sheet 20, in order to prevent the barrier columns 101 from damaging the mask sheet 20, the surfaces of the barrier columns 101 are covered with a resin material.

For example, a cladding structure 103 with a photosensitive resin-based organic material can be formed by a photolithography process on peripheries of the barrier columns 101.

For example, as shown in FIG. 2 to FIG. 6, a process for forming a mask plate using the manufacturing method of the mask plate provided by the embodiments of the present disclosure will be described with reference to a specific example. In the specific example, the material of the mask sheet 20 is invar alloy, and the material of the shaping mold 10 is aluminum.

For example, first, a surface of the mask sheet 20 on which the mask region A is formed is cleaned and dried, and then the mask sheet 20 is adhered to the shaping mold 10 on which the barrier columns 101 and the supporting part 102 are formed, and the barrier columns 101 in the shaping mold 10 are embedded in the mask openings 201 of the mask sheet 20. Then, the thermal separation adhesive is formed on the side of the mask sheet 20 away from the supporting part 102, so as to adhere the thermal separation adhesive to the surface of the mask sheet 20 away from the supporting part 102 and the surface of the barrier columns 101 away from the supporting part 102. Next, the mask sheet 20 to which the shaping mold 10 is adhered is fixed to the frame 30 by the stretching process, for example, the mask sheet 20 is stretched and welded to the frame 30, and the frame 30 and the mask sheet 20 which are welded together constitute a mask plate. Then, the thermal separation adhesive on the mask sheet 20 is heated to 80° C. to make the adhesiveness of the thermal separation adhesive fail, and the shaping mold 10 is separated from the mask plate simultaneously. Finally, for example, the surface of the mask plate is cleaned by an ethanol solvent to further remove the thermal separation adhesive that may be adhered to the mask plate. Thus, because before the mask sheet 20 is fixed to the frame 30 by the stretching process, the shaping mold 10 has been embedded in the mask region A of the mask sheet 10 and the mask sheet 20 is adhered to the shaping mold 20, when the mask sheet 20 is stretched to be fixed to the frame 30 by the stretching process, the effect of preventing the deformation of the mask region A can be achieved, and the straightness and the flatness of the mask plate can further be ensured.

An embodiment of the present disclosure further provide a mask plate, and the mask plate is manufactured using any one of the manufacturing methods of the mask plate described above, the accuracy of the mask region of the mask plate formed by the manufacturing method of the mask plate is high, so that the effect of a film formed by evaporating using the mask plate is more preferable.

What are described above are related to the specific implementations of the present disclosure only and not limitative to the scope of the present disclosure, within the disclosed technical scope of the present disclosure, the modification and replacement, which any skilled who is familiar with the technical field may easily conceive, should be covered within the scope of the protection of the present disclosure. Therefore, the scopes of the present disclosure are defined by the accompanying claims.

The following statements should be noted:
(1) The accompanying drawings involve only the structure(s) in connection with the embodiment(s) of the present disclosure, and other structure(s) can be referred to common design(s).
(2) In case of no conflict, features in one embodiment or in different embodiments can be combined.

What is claimed is:

1. A manufacturing method of a mask plate, comprising:
embedding a shaping mold in a mask region of a mask sheet;
fixing the mask sheet with the shaping mold;
performing a stretching process on the mask sheet fixed with the shaping mold; and
separating the mask sheet from the shaping mold to form the mask plate.

2. The manufacturing method of the mask plate according to claim 1, wherein, before the shaping mold is embedded in the mask region of the mask sheet, the manufacturing method further comprises: forming the mask region including a plurality of mask openings on the mask sheet,
the shaping mold comprises a plurality of barrier columns, and embedding the shaping mold in the mask region of the mask sheet comprises: embedding at least a portion of the plurality of barrier columns in at least a portion of the plurality of mask openings.

3. The manufacturing method of the mask plate according to claim 2, wherein the shaping mold further comprises a supporting part, the plurality of barrier columns are located on the supporting part, and the plurality of barrier columns protrude from a surface of the supporting part;
fixing the mask sheet with the shaping mold comprises:
forming an adhesive layer on a side of the mask sheet away from the supporting part, to adhere the mask sheet to the plurality of barrier columns.

4. The manufacturing method of the mask plate according to claim 3, wherein forming the adhesive layer on the side of the mask sheet away from the supporting part comprises:
attaching an anti-adhesive film including the adhesive layer on the side of the mask sheet away from the supporting part, wherein the adhesive layer is located on a side of the anti-adhesive film facing the mask sheet.

5. The manufacturing method of the mask plate according to claim 3, wherein, after forming the adhesive layer on the side of the mask sheet away from the supporting part, to adhere the mask sheet to the plurality of barrier columns, the manufacturing method of the mask plate further comprises: forming an anti-adhesive film on a side of the adhesive layer away from the mask sheet.

6. The manufacturing method of the mask plate according to claim 2, wherein the shaping mold further comprises a supporting part, the plurality of barrier columns are located on the supporting part, and the plurality of barrier columns protrude from a surface of the supporting part;
fixing the mask sheet with the shaping mold comprises:
forming an adhesive layer on a side of the supporting part facing the mask sheet, to adhere the mask sheet with the supporting part, a material of the adhesive layer comprising a thermal separation adhesive, and the thermal separation adhesive being configured to fail after being heated to a preset temperature.

7. The manufacturing method of the mask plate according to claim 3, wherein a material of the adhesive layer comprises a thermal separation adhesive, and the thermal separation adhesive is configured to fail after being heated to a preset temperature.

8. The manufacturing method of the mask plate according to claim 7, wherein the preset temperature is 60° C.~100° C.

9. The manufacturing method of the mask plate according to claim 7, wherein separating the shaping mold from the mask sheet to form the mask plate comprises: heating the mask sheet fixed with the shaping mold to the preset temperature to separate the shaping mold from the mask sheet.

10. The manufacturing method of the mask plate according to claim 2, wherein a size of at least one of the plurality of barrier columns in a direction perpendicular to a main plate surface of the mask sheet is greater than or equal to a thickness of the mask sheet.

11. The manufacturing method of the mask plate according to claim 2, wherein a surface of at least one of the plurality of barrier columns is provided with a cladding structure.

12. The manufacturing method of the mask plate according to claim 11, wherein a material of the cladding structure comprises a resin material.

13. The manufacturing method of the mask plate according to claim 1, wherein a material of the shaping mold comprises one or more selected from the group consisting of aluminum, magnesium, titanium and zinc.

14. The manufacturing method of the mask plate according to claim 2, wherein the plurality of barrier columns are embedded in the plurality of mask openings in a one-to-one correspondence manner.

* * * * *